United States Patent
Hong et al.

(10) Patent No.: US 10,629,542 B2
(45) Date of Patent: Apr. 21, 2020

(54) ELECTRONIC DEVICE MODULE

(71) Applicant: Samsung Electro-Mechanics Co., Ltd., Suwon-si (KR)

(72) Inventors: Suk Youn Hong, Suwon-si (KR); Jang Hyun Kim, Suwon-si (KR); Hye Kyung Kim, Suwon-si (KR); Seung Hyun Hong, Suwon-si (KR); Jong In Ryu, Suwon-si (KR)

(73) Assignee: Samsung Electro-Mechanics Co., Ltd., Suwon-si (KR)

(*) Notice: Subject to any disclaimer, the term of this patent is extended or adjusted under 35 U.S.C. 154(b) by 0 days.

(21) Appl. No.: 16/181,397

(22) Filed: Nov. 6, 2018

(65) Prior Publication Data

US 2019/0311994 A1    Oct. 10, 2019

(30) Foreign Application Priority Data

Apr. 5, 2018   (KR) ................. 10-2018-0039594
Jun. 4, 2018   (KR) ................. 10-2018-0064145

(51) Int. Cl.
| | | |
|---|---|---|
| *H05K 1/14* | (2006.01) | |
| *H01L 23/552* | (2006.01) | |
| *H05K 1/02* | (2006.01) | |
| *H01L 21/56* | (2006.01) | |
| *H01L 21/48* | (2006.01) | |
| *H05K 3/28* | (2006.01) | |
| *H05K 3/36* | (2006.01) | |

(Continued)

(52) U.S. Cl.
CPC ........ *H01L 23/552* (2013.01); *H01L 21/4814* (2013.01); *H01L 21/56* (2013.01); *H05K 1/023* (2013.01); *H05K 1/141* (2013.01); *H05K 3/284* (2013.01); *H05K 3/366* (2013.01); *H01L 23/5383* (2013.01); *H05K 1/181* (2013.01); *H05K 2201/10371* (2013.01); *H05K 2201/10522* (2013.01)

(58) Field of Classification Search
CPC ............ H05K 1/14; H05K 1/141–144; H05K 1/181–188; H05K 1/0024; H05K 9/00; H05K 9/002; H05K 9/004; H05K 9/0045; H01L 23/02; H01L 23/3121
USPC ................ 361/818, 816, 752–753, 807–810; 174/512, 350; 257/659
See application file for complete search history.

(56) References Cited

U.S. PATENT DOCUMENTS 7,049,682 B1 *  5/2006  Mathews ............... H01L 23/552
                                                          257/660
9,070,793 B2 *  6/2015  Liao .................... H01L 23/3121
(Continued)

FOREIGN PATENT DOCUMENTS

JP      2017-212377 A     11/2017
KR   10-2008-0078483 A     8/2008

*Primary Examiner* — Tuan T Dinh
(74) *Attorney, Agent, or Firm* — NSIP Law

(57) ABSTRACT

An electronic device module includes a substrate, at least one first component and at least one second component disposed on one surface of the substrate, a shielding wall disposed between the at least one first component and the at least one second component, and disposed on the substrate, and a sealing portion having the at least one first component, the at least one second component and the shielding wall embedded therein, and disposed on the substrate. The shielding wall includes at least one insulating layer and at least one conductive layer disposed on the insulating layer.

18 Claims, 6 Drawing Sheets

(51) Int. Cl.
*H01L 23/538* (2006.01)
*H05K 1/18* (2006.01)

(56) References Cited

U.S. PATENT DOCUMENTS

| | | | |
|---|---|---|---|
| 9,089,046 B2* | 7/2015 | Chen | H05K 9/002 |
| 2006/0258050 A1* | 11/2006 | Fujiwara | H01L 23/29 |
| | | | 438/112 |
| 2015/0043172 A1* | 2/2015 | Mugiya | H05K 9/0045 |
| | | | 361/728 |
| 2016/0270213 A1* | 9/2016 | Salehi | H05K 1/0224 |
| 2017/0345793 A1 | 11/2017 | Miyairi | |

* cited by examiner

ELECTRONIC DEVICE MODULE

CROSS-REFERENCE TO RELATED APPLICATIONS

This application claims the benefit under 35 USC 119(a) of Korean Patent Application Nos. 10-2018-0039594 filed on Apr. 5, 2018, and 10-2018-0064145 filed on Jun. 4, 2018, in the Korean Intellectual Property Office, the entire disclosures of which are incorporated herein by reference for all purposes.

BACKGROUND

1. Field

This application relates to an electronic device module, and more particularly, to an electronic device module in which a passive component, a semiconductor chip, or the like included in a module may be protected from an external environment while electromagnetic waves are able to be blocked.

2. Description of the Background

Recently, in the electronic products market, consumption of portable electronic products has increased rapidly, and there has accordingly been demand for electronic components to be mounted on a system to be small-sized and light-weighted.

To achieve this, it has been necessary to use a technique for reducing the sizes of individual components, and also, a system-on-chip (SOC) technique which integrates individual components into a single chip, or a system-in-package (SIP) technique which integrates individual components into a single package.

Particularly, in the case of a high frequency electronic device module using a high frequency signal, such as a communications module or a network module, it has been necessary to provide electromagnetic waves shielding structures having various forms to successfully implement shielding properties in relation to electromagnetic waves interference, along with miniaturization.

The above information is presented as background information only to assist with an understanding of the present disclosure. No determination has been made, and no assertion is made, as to whether any of the above might be applicable as prior art with regard to the disclosure.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an electronic device module includes a substrate, at least one first component and at least one second component disposed on one surface of the substrate, a shielding wall disposed between the at least one first component and the at least one second component, and disposed on the substrate, and a sealing portion having the at least one first component, the at least one second component and the shielding wall embedded therein, and disposed on the substrate. The shielding wall includes at least one insulating layer and at least one conductive layer disposed on the at least one insulating layer.

The electronic device module may further include a shielding layer disposed on a surface of the sealing portion. The at least one conductive layer may be electrically connected to the shielding layer.

The substrate may include a ground electrode disposed to be exposed to the outside of the sealing portion and electrically connected to the shielding layer.

The electronic device module may further include a bonding layer of a conductive material disposed on a lower end surface of the shielding wall opposing the substrate and on an upper end surface of the shielding wall connected to the shielding layer.

The electronic device module may further include a conductive adhesive agent disposed between the shielding wall and the substrate.

The shielding wall may further include an insulating film disposed between the at least one conductive layer and the sealing portion.

The insulating film may be an oxide film.

The at least one conductive layer may include conductive layers respectively disposed on opposing surfaces of the at least one insulating layer.

The shielding wall may include a plurality of interlayer connecting conductors penetrating through the at least one insulating layer and electrically connecting the conductive layers on the opposing surfaces.

The interlayer connecting conductor may include a first connecting conductor disposed in the at least one insulating layer and a second connecting conductor disposed on an edge of the at least one insulating layer.

At least a portion of the second connecting conductor may be disposed to be exposed to an upper end surface or a lower end surface of the shielding wall.

The second connecting conductor may be formed in smaller size than a size of the first connecting conductor.

The substrate may include a ground electrode disposed on a lower portion of the shielding wall and connected to the conductive layer.

The layers of the shielding wall may further include an external insulating layer disposed on an external surface of the at least one conductive layer.

In another general aspect, an electronic device module includes a first circuit substrate including a ground electrode, at least one first component and at least one second component disposed on one surface of the first circuit substrate, a second circuit substrate disposed between the at least one first component and the at least one second component, and disposed on the first circuit substrate to be substantially perpendicular to the first circuit substrate, and a sealing portion having the first component, the second component, and the second circuit substrate embedded therein, and disposed on the substrate. A wiring layer on the second circuit substrate is connected to the ground electrode on the first circuit substrate.

The second circuit substrate may further include an insulating layer, and a plurality of interlayer connecting conductors penetrating through the insulating layer, wherein the wiring layer may include two wiring layers disposed on opposing surfaces of the insulating layer, and the plurality of interlayer connecting conductors may connect the two wiring layers to each other.

In another general aspect, an electronic device module includes a first substrate having a first region and a second region on a surface, a second substrate including a ground layer electrically connected to the first substrate, the second substrate disposed on the surface and extending from the surface to divide the surface into the first region and the second region.

The first region and the second region may be electromagnetically shielded from each other by the second substrate.

The electronic device module may further include a first component disposed in the first region, a second component disposed in the second region, a first sealing portion embedding the first component, a second sealing portion embedding the second component, and a shielding layer disposed on the first and second sealing portions electrically connected to the ground layer. The second substrate may be embedded in the first and second sealing portions.

The second substrate may further include an insulating layer, interlayer conductors penetrating through the insulating layer, and an insulating film. The ground layer may include a first conductive layer on one surface of the insulating layer and a second conductive layer on an opposite surface of the insulating layer electrically connected to the first conductive layer by the interlayer conductors. The insulating film may be disposed on the first and second conductive layers.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
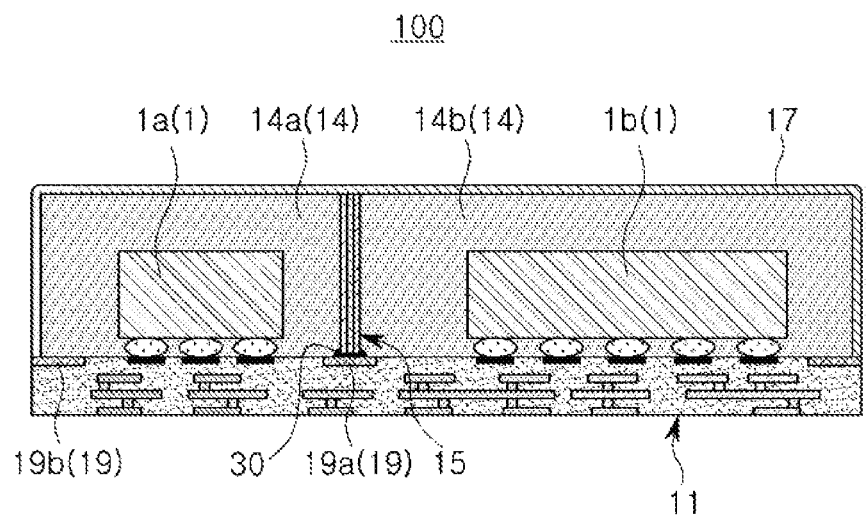
FIG. 1 is a cross-sectional view of an electronic device module according to one or more examples.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application. Hereinafter, while embodiments of the present disclosure will be described in detail with reference to the accompanying drawings, it is noted that examples are not limited to the same.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items; likewise, "at least one of" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Herein, it is noted that use of the term "may" with respect to an example, for example, as to what an example may include or implement, refers to at least one example in which such a feature is included or implemented while all examples are not limited thereto.

An aspect of the present disclosure may provide an electronic device module including internal components able to be protected from impact and an electromagnetic shielding structure having excellent electromagnetic wave interference resistance properties and/or electromagnetic wave resistance properties.

Figure 2:
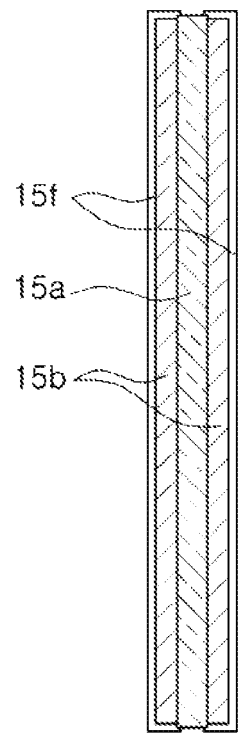
FIG. 2 is a magnified view of an example shielding wall of an electronic device module shown in FIG. 1.

FIG. 1 is a cross-sectional view of an electronic device module according to one or more examples. FIG. 2 is a magnified view of an example shielding wall of an electronic device module shown in FIG. 1.

Referring to FIGS. 1 and 2, an electronic device module 100 according to one or more examples may include a substrate 11, electronic components 1, a sealing portion 14, a shielding wall 15, and a shielding layer 17.

On a first surface of the substrate 11, mounting electrodes for mounting the electronic components 1, a ground electrode 19, and although not illustrated, a wiring pattern in which the mounting electrodes are electrically connected to each other, may be disposed.

At least one electronic component 1 may be mounted on the mounting electrodes.

The substrate 11 includes the ground electrode 19. The ground electrode 19 may be disposed in a region below the shielding wall 15. The ground electrode 19 may face a lower portion of the shielding wall 15, where the lower portion of the shielding wall 15 is a bottom side or lower end in FIGS. 1 and 2. The ground electrode 19 may be disposed on the lower portion of the shielding wall 15. The lower portion of the shielding wall 15 may be disposed on the ground electrode 19. The ground electrode 19 may be electrically connected to the shielding wall 15 and the shielding layer 17. To this end, the ground electrode 19 may be divided into a first ground electrode 19a and a second ground electrode 19b. For example, the first ground electrode 19a may be directly connected to the shielding wall 15 and the second ground electrode 19b may be directly connected to the shielding layer 17.

The first ground electrode 19a may be disposed inside the substrate 11, and the shielding wall 15 may be bonded to the first ground electrode 19a. The second ground electrode 19b may be disposed on an edge portion of the substrate 11, and the shielding layer 17 may be connected to the second ground electrode 19b.

In the examples, the first ground electrode 19a may be disposed between the first component 1a and the second component 1b, and may be formed in a form of a line along a form of the shielding wall 15.

Also, in the examples, the ground electrode 19 may be formed in solid line form. However, embodiments thereof are not limited thereto. The ground electrode 19 may be formed in various manners as long as the ground electrode 19 is able to be electrically connected to the shielding wall 15 or the shielding layer 17. For example, the ground electrode 19 may be formed as a broken line or a dotted line.

Although not illustrated in detail, the electrodes for mounting the electronic components 1 or the ground electrode 19 may be protected by protective insulation layers (not illustrated) disposed in layers on an upper portion, and may be exposed externally through an opening formed in the protective insulation layer. As the protective insulation layer, a solder resist may be used, but the protective insulation layer is not limited thereto.

The substrate 11 configured as above may be implemented by various types of circuit substrates (e.g., a ceramic substrate, a printed circuit substrate, a flexible substrate, and the like) generally used in the respective technical field. The substrate 11 according to the various examples may be a multilayer substrate 11 formed to have a plurality of layers, and a circuit pattern may be formed between the layers.

The electronic components 1 may include a variety of electronic devices such as a passive device and an active device. In other words, the electronic components 1 may be implemented by any electronic components able to be mounted on or inside the substrate 11.

The electronic components 1 in the example may include at least one first component 1a embedded in a first sealing portion 14a and a second component 1b embedded in a second sealing portion 14b. The first component 1a and the second component 1b may be implemented by devices between which electrical interference occurs. However, embodiments thereof are not limited thereto.

The sealing portion 14 may be disposed on the first surface of the substrate 11 and seal the electronic components 1. The sealing portion 14 may fix the electronic components 1 by sealing the components externally, thereby protecting the electronic components 1 safely from an external impact. However, as described above, the first component 1a may not be embedded in the sealing portion 14 but may be disposed at an external side of the sealing portion 14.

The sealing portion 14 according to the various embodiments may be formed of an insulation material. For example, the sealing portion 14 may be formed of a resin material such as an epoxy molding compound (EMC), but is not limited thereto. Also, if necessary, the sealing portion 14 may be formed of a conductive material (e.g., a conductive resin, and the like). In this case, an individual sealing portion, such as an underfill resin, may be provided between the electronic components 1 and the substrate 11.

Also, the sealing portion 14 may be divided into the first sealing portion 14a and the second sealing portion 14b by the shielding wall 15.

The shielding wall 15 may be disposed between the first component 1a and the second component 1b and block electromagnetic waves flowing into the second component 1b from the first component 1a or flowing into the first component 1a from the second component 1b.

Accordingly, the shielding wall 15 may include a conductive material electrically connected to the ground electrode 19 on the substrate 11. For example, a conductive material of the shielding wall 15 may be a metal plate, and may be bonded to the first ground electrode 19a on the substrate 11 by means of a conductive adhesive agent 30 such as a solder or a conductive resin.

In the examples, the shielding wall 15 may be a planar plate, and may include at least one insulating layer 15a and a conductive layer 15b disposed on at least one surface of the insulating layer 15a. For example, the conductive layer 15b may be disposed on one surface of the insulating layer 15a or on both surfaces of the insulating layer 15a as illustrated in FIG. 2.

In the examples, in the shielding wall 15, the conductive layer 15b may be disposed on both surfaces of the insulating layer 15a. Accordingly, the shielding wall 15 may be formed as a two-layer substrate in which the insulating layer 15a is interposed between two of the conductive layers 15b.

However, embodiments thereof are not limited thereto. The shielding wall 15 may be modified in various forms as long as the shielding wall 15 is able to block electromagnetic waves flowing between the first component 1a and the second component 1b. For example, the shielding wall 15 may be implemented as a multilayer substrate having three or more layers.

The insulating layer 15a may be formed of a resin material such as epoxy. Also, the conductive layer 15b may be implemented as a metal thin film such as a copper foil. In the example, a thickness of each of the conductive layers 15b may be 20 microns (μm) or less, and the insulating layer 15a may have a thickness in which the insulating layer 15a is not deformed by pressure applied by molding resin during the process of forming the sealing portion 14.

A thickness of the insulating layer 15a may be increased to prevent the electronic device module from bending.

In the examples, a circuit substrate (printed circuit board (PCB) or the like) may be used as the shielding wall 15. Accordingly, the conductive layer 15b provided in the shielding wall 15 may be implemented as a wiring layer on a circuit substrate (PCB). However, embodiments thereof are not limited thereto.

A mounting height of the shielding wall 15 may be configured to be equal to a height of the sealing portion 14. Accordingly, an upper end (top side or upper portion) of the shielding wall 15 may be exposed externally of the sealing portion 14, and the shielding layer 17 may be connected to the exposed upper end of the shielding wall 15. The mounting height may refer to a distance between the first surface of the substrate 11 and the upper end surface of the shielding wall 15.

The shielding wall 15 may be bonded to the first ground electrode 19a on the substrate 11 by a conductive adhesive agent such as a solder or a conductive epoxy. However, embodiments thereof are not limited thereto. For example, in the case in which the shielding wall 15 is electrically connected to the second ground electrode 19b through the shielding layer 17, it may be possible to bond the shielding wall 15 to the substrate 11 using an insulating adhesive agent.

Meanwhile, as illustrated in FIG. 2, in the shielding wall 15, an insulating film 15f may be disposed on a surface of the conductive layer 15b. The insulating film 15f may be an oxide film. The insulating film 15f may increase bonding strength between the sealing portion 14 formed of a resin material and the shielding wall 15.

However, the insulating film 15f may not be limited to an oxide film. The insulating film 15f may be formed of other materials such as a resin layer or an inorganic film, or other various modifications may be possible.

The shielding layer 17 may be formed along a surface of the sealing portion 14, and block electromagnetic waves flowing into the electronic components 1 from the outside or leaking from the electronic components 1 to the outside. Thus, the shielding layer 17 may be formed of a conductive material, and may be electrically connected to the second ground electrode 19b on the substrate 11.

To electrically connect the shielding layer 17 and the second ground electrode 19b on the substrate 11, at least a portion of the second ground electrode 19b on the substrate 11 may be exposed externally of the sealing portion 14.

The shielding layer 17 may be formed by coating an external surface of the sealing portion 14 with a resin material including a conductive powder, or by forming a metal thin film. In the case of forming a metal thin film, various methods such as a sputtering method, a screen printing method, a vapor deposition method, an electroplating method, an electroless plating method, and the like, may be used.

For example, the shielding layer 17 may be a metal thin film formed on an external surface of the sealing portion 14 by a spray coating method. By the spray coating method, an evenly coated film can be formed, and costs, in terms of infrastructure investment, may be relatively lower than other processes. However, embodiments thereof are not limited thereto. The metal thin film may also be formed using a sputtering method.

Also, the shielding layer 17 may be electrically connected to the shielding wall 15. The shielding layer 17 may also be disposed on an end of the conductive layer 15b of the shielding wall 15, which is exposed to an upper surface of the sealing portion 14, and may be electrically connected to the conductive layer 15b of the shielding wall 15.

In the case in which the shielding layer 17 and the shielding wall 15 are connected to each other as above, connection to the ground electrode 19 may be omitted in one of the shielding layer 17 and the shielding wall 15. However, embodiments thereof are not limited thereto. The shielding layer 17 and the shielding wall 15 may be indirectly connected to each other through the ground electrode 19 on the substrate 11, not connecting the shielding layer 17 and the shielding wall 15 directly, or other various modifications may be possible.

Thus, in the electronic device module according to the embodiments as above, the electronic components 1 mounted on the substrate 11 may be protected from an external environment by the sealing portion 14 or the shielding layer 17, and electromagnetic waves may be readily shielded as well.

Also, as the shielding wall 15 is disposed between the first component 1a and the second component 1b, electromagnetic interference between the first component 1a and the second component 1b may be prevented.

Further, the shielding wall 15 may be formed in various manners by adjusting a thickness of the insulating layer 15a of the shielding wall 15. For example, warpage of the electronic device module may be significantly reduced by adjusting a material and a thickness of the insulating layer 15a.

In the description below, a method of manufacturing an electronic device module will be described according to one or more examples.

Figure 3:
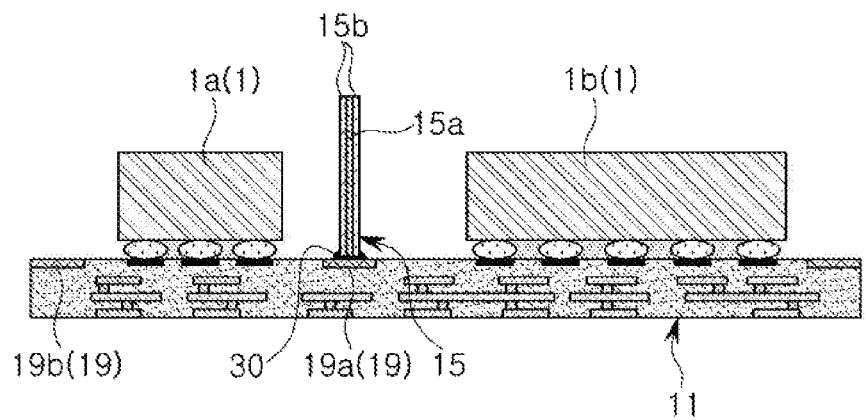
FIGS. 3, 4, and 5 are views illustrating processes in a method of manufacturing an electronic device module in order according to one or more examples.
Figure 4:
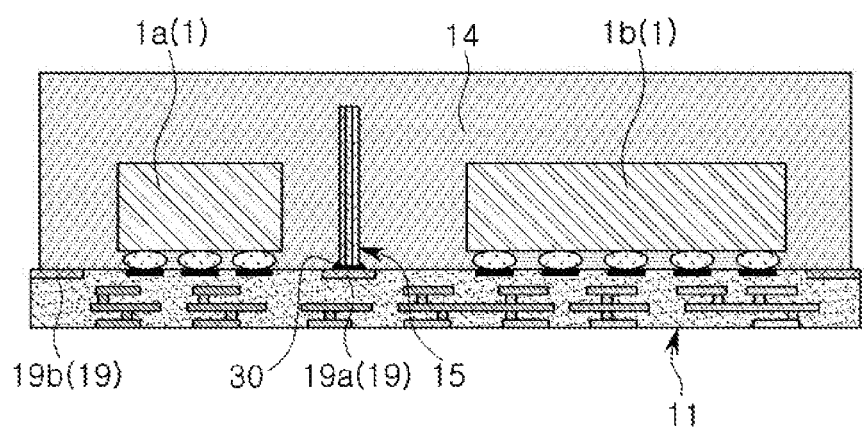
Figure 5:
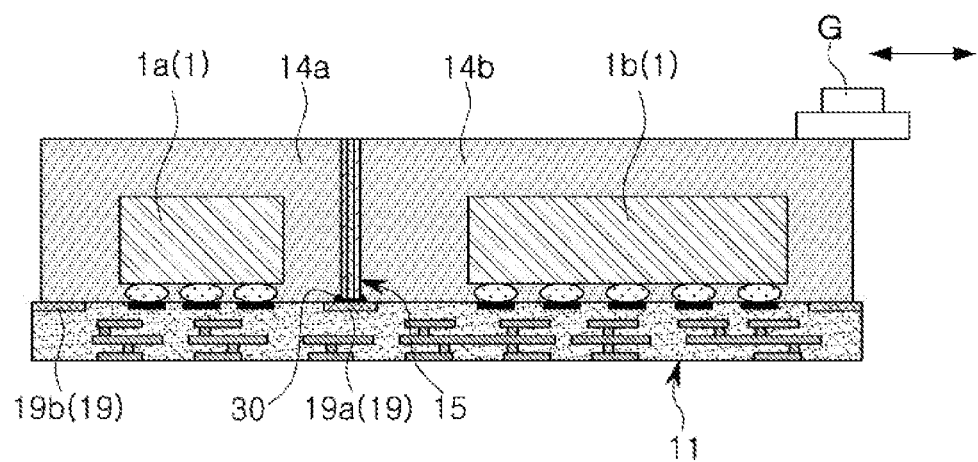

FIGS. 3, 4, and 5 are views illustrating processes in a method of manufacturing an electronic device module in order according to one or more examples.

As illustrated in FIG. 3, electronic components 1 and a shielding wall 15 may be mounted on a first surface of a substrate 11.

In the examples, the substrate 11 may be a multilayer circuit substrate having a plurality of layers, and electrically connected circuit patterns may be formed between the layers. Also, an electrode for mounting a component, a ground electrode 19, and the like, may be formed on an upper surface of the substrate 11, which is the first surface.

The electronic components 1 and the shielding wall 15 may be bonded to the substrate 11 by a conductive adhesive agent 30 such as a solder. In this process, conductive layers 15b of the shielding wall 15 may be electrically connected to the ground electrode 19 by being bonded to the conductive adhesive agent 30.

Then, as illustrated in FIG. 4, a sealing portion 14 sealing the electronic components 1 and the shielding wall 15 may be formed on the first surface of the substrate 11.

The sealing portion 14 may be formed on an overall area of the first surface of the substrate 11 or may be partially formed on the first surface. Also, the sealing portion 14 may be formed with the electronic components 1 and the overall shielding wall 15 embedded therein. However, at least a portion of the second ground electrode 19b may be exposed externally of the sealing portion 14. Such a configuration may be implemented by configuring a mold such that the second ground electrode 19b is exposed during a molding process in which the sealing portion 14 is formed, or by forming the sealing portion 14 on an overall area of the first surface of the substrate 11 and removing a portion of the sealing portion 14 which covers the second ground electrode 19b, or by other methods.

In this process, the sealing portion 14 may be manufactured by a transfer molding method, but embodiments thereof are not limited thereto.

Then, as illustrated in FIG. 5, the sealing portion 14 may be partially removed.

In this process, the sealing portion 14 may be removed from an upper portion thereof by a grinder (G), or the like, and may be removed until an upper end of the shielding wall 15 is exposed externally of the sealing portion 14. Accordingly, the sealing portion 14 may be divided into a first sealing portion 14a and a second sealing portion 14b by the shielding wall 15. The first sealing portion 14a may be isolated from the second sealing portion 14b by the shielding wall 15. Communication between the first sealing portion 14a and the second sealing portion 14b may be blocked by the shielding wall 15.

Then, the electronic device module in FIG. 1 may be manufactured by forming a shielding layer 17 on a surface of the sealing portion 14.

The shielding layer 17 may be formed by coating an external surface of the sealing portion 14 with a resin material including a conductive powder, or by forming a metal thin film. In the case of forming a metal thin layer, various methods such as a sputtering method, a spray coating method, a screen printing method, a vapor deposition method, an electroplating method, an electroless plating method, and the like, may be used.

In this process, the shielding layer 17 may be electrically connected to at least one of the shielding wall 15 and the second ground electrode 19b exposed externally of the sealing portion 14.

In the electrode device module manufactured through the aforementioned processes according to the one or more embodiments, a circuit substrate such as a printed circuit board (PCB) may be used, and a shielding wall may be disposed between a first component and a second component by a surface mounting method. Accordingly, the process of forming a trench in a sealing portion to form a shielding wall between the first component and a second component may not be necessary, and thus, the electronic device module may be easily manufactured.

Meanwhile, the electronic device module is not limited to the aforementioned embodiments, and various applications thereof may be possible.

Figure 6:
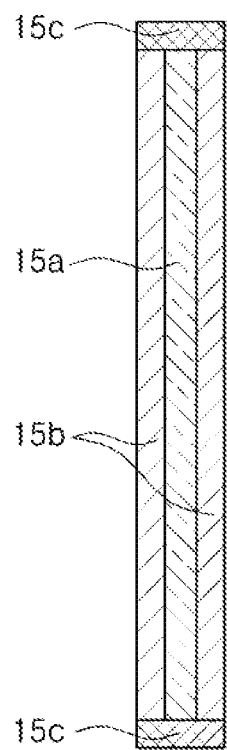
FIG. 6 is a cross-sectional view of a shielding wall according to other various examples.

FIG. 6 is a cross-sectional view of a shielding wall according to another embodiment in the present disclosure.

Referring to FIG. 6, the shielding wall 15 according to the embodiment may be configured as in the aforementioned embodiments, and a difference may be that a bonding layer 15c of a conductive material is formed on an upper end surface and a lower end surface of the shielding wall 15.

The bonding layer 15c disposed on the upper and lower end surfaces may be formed by coating the upper and lower end surfaces with a conductive material by a sputtering method or a dipping method. However, embodiments thereof are not limited thereto.

In the case in which the shielding wall 15 is formed as above, a bonding area between a ground electrode 19 on a substrate 11 or a shielding layer 17 and the shielding wall 15 may increase by the bonding layer 15c disposed on the upper and lower end surfaces. Accordingly, bonding reliability may increase.

Meanwhile, the bonding layer 15c may be disposed on an overall area of an upper end surface or of a lower end surface of the shielding wall 15. However, embodiments thereof are not limited thereto. The bonding layer may be partially disposed on an upper end surface or a lower end surface.

Figure 7:
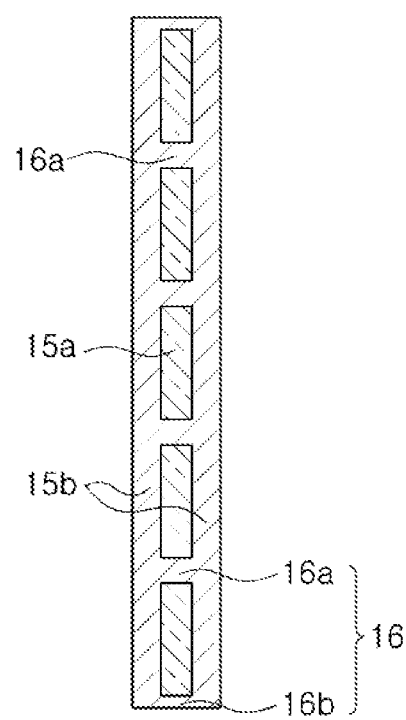
FIG. 7 is a cross-sectional view of a shielding wall according to still other various examples.
Figure 8:
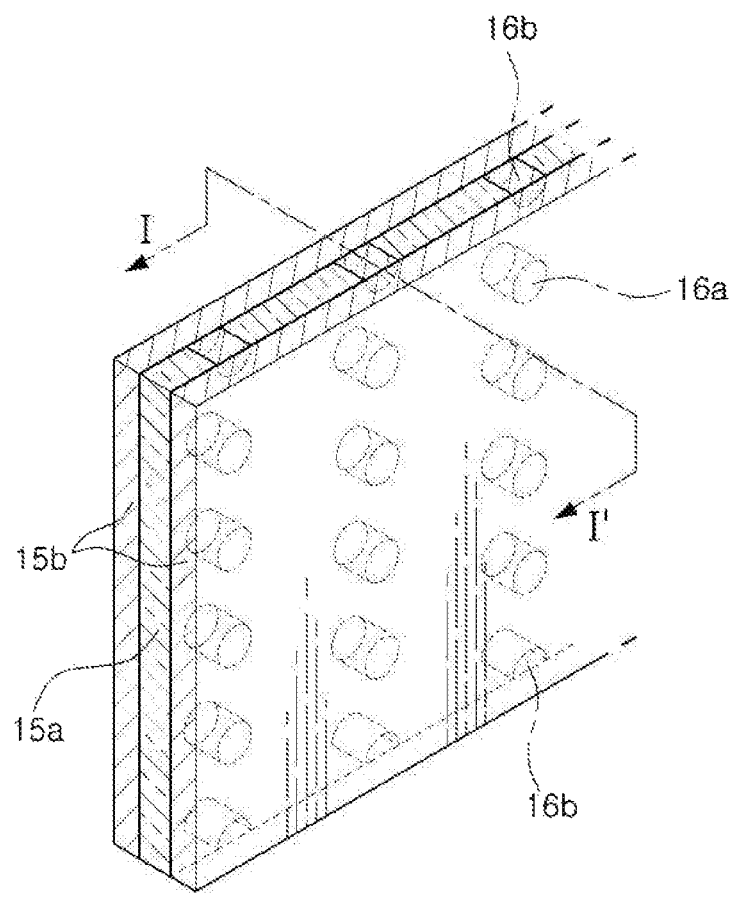
FIG. 8 is a perspective view of a shielding wall shown in FIG. 7.

FIG. 7 is a cross-sectional view of a shielding wall according to other various examples in the present disclosure. FIG. 8 is a perspective view of a shielding wall shown in FIG. 7. FIG. 7 is a cross-sectional view taken along line I-I' in FIG. 8.

Referring to FIGS. 7 and 8, the shielding wall 15 may include at least one interlayer connecting conductor 16 penetrating through the insulating layer 15a.

The interlayer connecting conductor 16 may be formed by disposing a conductive material in a through-hole penetrating through the insulating layer 15a. For example, the interlayer connecting conductor 16 may be formed as a conductive via. Thus, the interlayer connecting conductor 16 may be formed by filling the through-hole with a conductive material or by coating an internal wall of the through-hole with a conductive material.

Two conductive layers 15b disposed on both surfaces of the insulating layer 15a may be electrically connected by the interlayer connecting conductor 16. The interlayer connecting conductor 16 may be formed of the same material as that of the conductive layers 15b, but is not limited thereto.

In the example, the interlayer connecting conductor 16 may include at least one first connecting conductor 16a disposed inside the insulating layer 15a and at least one second connecting conductor 16b disposed on an edge side of the insulating layer 15a.

The first connecting conductor 16a may be disposed inside the insulating layer 15a and may electrically connect the two conductive layers 15b, thereby improving bonding strength between the two conductive layers 15b.

The first connecting conductor 16a may be disposed on an upper end surface or a lower end surface of the shielding wall 15, and may be partially exposed through the upper end surface or the lower end surface of the shielding wall 15. The second connecting conductor 16b may be formed by cutting the shielding wall 15 to allow the interlayer connecting conductor 16 to be exposed to the lower end surface or the upper end surface of the shielding wall 15 during the process of manufacturing the shielding wall 15. Thus, the second connecting conductor 16b may be formed in smaller size than that of the first connecting conductor 16a.

The second connecting conductor 16b and the first connecting conductor 16a may perform the same function, and may expand a bonding area in which the shielding wall 15 is bonded to a ground electrode 19 on a substrate 11 or the shielding wall 17. Accordingly, bonding reliability between the shielding wall 15 and the substrate 11 or the shielding layer 17 may improve.

Meanwhile, in the examples, the first connecting conductor 16a may have a cylindrical shape, and the second connecting conductor 16b may have a semi-cylindrical shape, for example. However, embodiments thereof are not limited thereto. For instance, to expand the bonding area, the plurality of second connecting conductors 16b may be consecutively disposed to be in contact with each other.

Also, in the examples, the interlayer connecting conductor 16 may be formed such that an internal space of the through-hole is entirely filled, but embodiments thereof are not limited thereto. The interlayer connecting conductor 16 may also be formed such that a space is formed inside the through-hole in a form of a through hole by coating only an internal wall of the through-hole with a conductive material without entirely filling an internal space of the through-hole.

In this case, a sealing portion may be inserted in the internal space formed in the first connecting conductor 16a. Also, a conductive adhesive agent may be applied in the internal space formed in the second connecting conductor 16b.

Figure 9:
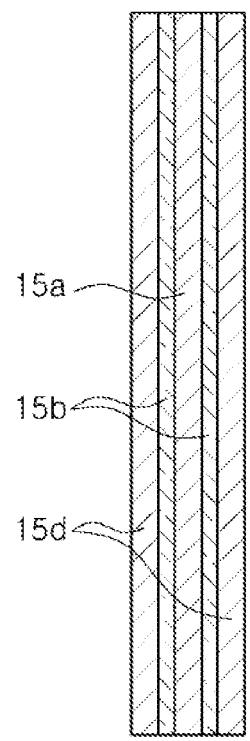
FIG. 9 is a cross-sectional view of a shielding wall according to still other various examples.

FIG. 9 is a cross-sectional view of a shielding wall according to other various examples.

Referring to FIG. 9, in the shielding wall 15 according to the embodiment, an external insulating layer 15d may be disposed on each of external sides of conductive layers 15b.

Accordingly, the shielding wall 15 in the examples may have a structure in which three insulating layers 15a and 15d and two conductive layers 15b are alternately layered.

The external insulating layer 15d may be formed of a resin material.

Accordingly, by configuring a surface of the shielding wall 15 contacting a sealing portion 14 as the external insulating layer 15d, bonding properties with the sealing portion 14 formed of a resin material may improve as described above.

Meanwhile, in the examples, an example in which the insulating layers 15a and 15d are formed of the same material is suggested. However, embodiments thereof are not limited thereto. For example, the insulating layer 15a interposed between the conductive layers 15b may be formed of a different material than the external insulating layer 15d.

Also, embodiments thereof are not limited to the aforementioned embodiments. If necessary, more conductive layers and insulating layers may be layered on a surface of the insulating layer 15d, and other various modifications may be possible.

The electronic device module according to the embodiments described herein may be easily manufactured in that, as a circuit substrate such as a printing circuit substrate is used, a shielding wall is able to be disposed between a first component and a second component. Also, the shielding wall may be configured in various manners by adjusting a thickness of an insulating layer of the shielding wall. Accordingly, warpage of the electronic device module may be significantly reduced.

While specific examples have been shown and described above, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An electronic device module comprising: a substrate;
a first component and at least a second component disposed on one surface of the substrate;
a shielding wall disposed between the first component and the second component, and disposed on the substrate; and
a sealing portion comprising the at first component, the second component and the shielding wall embedded therein, and disposed on the substrate,
wherein the shielding wall comprises:
an insulating layer,
a first conductive layer disposed on a first surface of the insulating layer,
a second conductive layer disposed on a second surface of the insulating layer opposing the first surface, and
an interlayer connecting conductor disposed in the insulating layer penetrating through the insulating layer from the first surface to the second surface to electrically connect the first conductive layer to the second conductive layer, and
a shielding layer disposed on a surface of the sealing portion,
wherein the first and second conductive layers are electrically connected to the shielding layer.

2. The electronic device module of claim 1, wherein the substrate comprises a ground electrode disposed to be exposed to the outside of the sealing portion and electrically connected to the shielding layer.

3. The electronic device module of claim 1, further comprising a bonding layer of a conductive material disposed on a lower end surface of the shielding wall opposing the substrate and on an upper end surface of the shielding wall connected to the shielding layer.

4. The electronic device module of claim 1, further comprising:
a conductive adhesive agent disposed between the shielding wall and the substrate.

5. The electronic device module of claim 1, wherein the shielding wall further comprises:
an insulating film disposed between each of the first conductive layer and the sealing portion and the second conductive layer and the sealing portion.

6. The electronic device module of claim 1, wherein the interlayer connecting conductor comprises a conductive material disposed in a through-hole penetrating through the insulating layer.

7. The electronic device module of claim 1, wherein the substrate comprises a ground electrode disposed on a lower portion of the shielding wall and connected to the first and second conductive layers.

8. The electronic device module of claim 1, wherein the layers of the shielding wall further comprise an external insulating layer disposed on an external surface of one or more of the first and second conductive layers.

9. The electronic device module of claim 5, wherein the insulating film comprises an oxide film.

10. The electronic device module of claim 6, wherein the shielding wall comprises a plurality of interlayer connecting conductors penetrating through the insulating layer and electrically connecting the first and second conductive layers on the opposing surfaces.

11. The electronic device module of claim 10, wherein the interlayer connecting conductors comprise a first connecting conductor disposed in the insulating layer and a second connecting conductor disposed on an edge of the insulating layer.

12. The electronic device module of claim 11, wherein at least a portion of the second connecting conductor is disposed to be exposed to an upper end surface or a lower end surface of the shielding wall.

13. The electronic device module of claim 12, wherein the second connecting conductor is formed in smaller size than a size of the first connecting conductor.

14. An electronic device module, comprising: a first circuit substrate including a ground electrode;
   at least one first component and at least one second component disposed on one surface of the first circuit substrate;
   a second circuit substrate disposed between the at least one first component and the at least one second component and disposed on the first circuit substrate to be substantially perpendicular to the first circuit substrate; and
   a sealing portion having the at least one first component, the at least one second component and the second circuit substrate embedded therein, and disposed on the substrate,
   wherein the second circuit substrate comprises an insulating layer, two wiring layers disposed on opposing surfaces of the insulating layer, and a plurality of interlayer connecting conductors penetrating through the insulating layer to connect the two wiring layers to each other,
   wherein a wiring layer on the second circuit substrate is connected to the ground electrode on the first circuit substrate, and
   a shielding layer disposed on a surface of the sealing portion,
   wherein the first and second conductive layers are electrically connected to the shielding layer.

15. The electronic device module of claim 14, wherein the plurality of interlayer connecting conductors penetrating through the insulating layer each comprise a conductive material disposed in a through-hole penetrating through the insulating layer.

16. An electronic device module, comprising:
   a first substrate comprising a first region and a second region on a surface;
   a first component disposed in the first region;
   a second component disposed in the second region;
   a second substrate disposed on the surface and extending from the surface to divide the surface into the first region and the second region,
   a first sealing portion embedding the first component;
   a second sealing portion embedding the second component;
   wherein the second substrate comprises:
   an insulating layer;
   a first conductive layer on one surface of the insulating layer facing the first region and a second conductive layer on an opposite surface of the insulating layer facing the second region;
   interlayer conductors each comprising a conductive material disposed in a through-hole penetrating through the insulating layer to electrically connect the first and second conductive layers,
   wherein the first and second conductive layers are electrically connected to the first substrate, and
   a shielding layer disposed on the first and second sealing portions electrically connected to the first and second conductive layers,
   wherein the second substrate is embedded in the first and second sealing portions.

17. The electronic device module of claim 16, wherein the first region and the second region are electromagnetically shielded from each other by the second substrate.

18. The electronic device module of claim 16, wherein the second substrate further comprises an insulating film disposed on the first and second conductive layers,
   wherein the first and second conductive layers are connected to a ground layer, and
   wherein the conductive material of one or more of the interlayer conductors is disposed as a coating on an internal wall of the corresponding through-hole.

* * * * *